(12) United States Patent
Laptev

(10) Patent No.: US 7,270,729 B2
(45) Date of Patent: Sep. 18, 2007

(54) SYSTEM FOR, AND METHOD OF, ETCHING A SURFACE ON A WAFER

(75) Inventor: Pavel N. Laptev, Santa Barbara, CA (US)

(73) Assignee: Tegal Corporation, Petaluma, CA (US)

(*) Notice: Subject to any disclaimer, the term of this patent is extended or adjusted under 35 U.S.C. 154(b) by 682 days.

(21) Appl. No.: 10/633,839

(22) Filed: Aug. 4, 2003

(65) Prior Publication Data

US 2004/0038548 A1 Feb. 26, 2004

Related U.S. Application Data

(62) Division of application No. 09/829,587, filed on Apr. 9, 2001.

(51) Int. Cl.
*C23C 14/34* (2006.01)
(52) U.S. Cl. .................. 204/192.32; 204/192.35; 204/192.37; 204/298.31; 204/298.34
(58) Field of Classification Search .......... 204/192.32, 204/192.35, 192.37, 298.31, 298.34
See application file for complete search history.

(56) References Cited

U.S. PATENT DOCUMENTS 4,624,767 A * 11/1986 Obinata ................ 204/298.37
4,950,377 A * 8/1990 Huebner ............... 204/192.32

\* cited by examiner

*Primary Examiner*—Rodney G. McDonald
(74) *Attorney, Agent, or Firm*—Fliesler Meyer LLP

(57) ABSTRACT

First and second electrodes and magnets between the electrodes define an enclosure. The first electrode is biased at a high voltage to produce a high intensity electrical field. The second electrode is biased at a low negative voltage by a low alternating voltage to produce a low intensity electrical field. Electrons movable in a helical path in the enclosure near the first electrode ionize inert gas molecules in the enclosure. A wafer having a floating potential and an insulating layer is closely spaced from the second electrode. The second electrode and the wafer define plates of a first capacitor having a high impedance. The wafer and the inert gas ions in the enclosure define opposite plates of a second capacitor. The first capacitor accordingly controls and limits the speed at which the gas ions move to the insulating layer surface to etch this surface. The resultant etch, only a relatively few angstroms, of the insulating layer is smooth, uniform and accurate.

12 Claims, 2 Drawing Sheets

PRIOR ART  PRIOR ART

SYSTEM FOR, AND METHOD OF, ETCHING A SURFACE ON A WAFER

RELATED APPLICATIONS

This is a divisional of Ser. No. 09/829,587, filed Apr. 9, 2001.

BACKGROUND OF A PREFERRED EMBODIMENT OF THE INVENTION

This invention relates to apparatus for, and methods of, etching a surface of a wafer to provide a fresh and clean surface for providing a deposition on the surface. More particularly, the invention relates to apparatus for, and methods of, etching a surface of an insulating layer in a wafer, and etching walls defining a socket in the wafer, so that the etchings of the surface of the insulating layer, and the etching of the surfaces of the walls in the socket, are smooth and uniform and so that the surfaces do not have any pits.

BACKGROUND OF THE INVENTION

Integrated circuit chips are being used now in all kinds of apparatus to provide complex electrical circuitry for controlling different operations or for providing data and mathematical calculations in business, education, science and many other fields. With successive advances in time, the size of the integrated circuit chips has progressively decreased, particularly because the thickness of the electrical leads in the chips has progressively decreased. Even as the chips have decreased in size, the circuitry on the chips has become progressively complex.

The integrated chips are formed in wafers, each of which holds a number, hundreds and often even thousands, of integrated circuit chips. The chips on the wafer are formed from a plurality of successive layers. Some of the layers provide electrical insulation. Others of the layers are electrically conductive. Electrical pegs or vias are provided between the different electrically conductive layers. The electrical pegs or vias are disposed in sockets provided in insulating layers in the chips. When the fabrication of the wafers has been completed, each chip defines electrical circuitry which performs specialized, often complex, operations.

The fabrication of the different layers in an integrated circuit chip has to be precise. For example, the width and thickness of the circuit leads in the different layers have to be precise in order to maintain the proper impedance values for different components in the circuits. If the proper impedance values are not maintained, the operation of the circuitry in the integrated circuit chip is impaired. Variations in the width and thickness of the circuit leads can result from impurities in the surfaces of different layers in the chips and from uneven and non-smooth surfaces on the insulating layers on which electrically conductive material is deposited. The criticality in maintaining surfaces even and smooth has increased as the thickness of the leads on the integrated circuit chips has decreased.

Apparatus has existed for a considerable number of years to etch the surfaces of different layers on the chips. The purpose of the etching has been to clean and refresh the surfaces to receive subsequent layers of deposition. The etching has produced uneven surfaces on the layers, thereby producing variations in the characteristics of the electrical material subsequently deposited on the uneven surfaces. The problem has been aggravated as the thickness of the layers has decreased. Attempts have been made to resolve this problem by making the etched surfaces even and uniform. The attempts have provided significant success but improvements in the smoothness and evenness of the surfaces of the insulating layer are constantly desired.

BRIEF DESCRIPTION OF A PREFERRED EMBODIMENT OF THE INVENTION

First and second electrodes at opposite ends and magnets between the electrodes define an enclosure. Inert gas (e.g. argon) molecules pass into the enclosure through an opening near the first electrode and from the enclosure through an opening near the second electrode. A ring near the first electrode, a plate near the second electrode and the magnets are at a reference potential (e.g. ground).

The first electrode is biased at a high negative voltage by a high alternating voltage to produce a high intensity electrical field. The second electrode is biased at a low negative voltage by a low alternating voltage to produce a low intensity electrical field. Electrons movable in a helical path in the enclosure near the first electrode ionize inert gas molecules.

A wafer having a floating potential and having an insulating layer is closely spaced from the second electrode. The electrode and the wafer define plates of a first capacitor having a dielectric formed by inert gas molecules and ions between the plates to provide a high impedance. The wafer and the gas ions in the enclosure define opposite plates of a second capacitor, in series with the first capacitor, having the insulating layer as the dielectric to define a low impedance.

The first capacitor accordingly controls and limits the speed at which the gas ions move to the insulating layer surface to etch this surface. The resultant etch, only of a relatively few angstroms, of the insulating layer is smooth, uniform and accurate even in holes as for vias and does not have any pits.

BRIEF DESCRIPTION OF THE DRAWINGS

In the drawings:

FIG. 5a is an enlarged fragmentary schematic elevational view showing the disposition in the prior art of the particular ones of the components shown in FIG. 4a; and FIG. 5b is an enlarged fragmentary schematic circuit diagram showing the electrical equivalent of the disposition of the prior art components in FIG. 5a as a single capacitor having a low impedance.

DETAILED DESCRIPTION OF A PREFERRED EMBODIMENT OF THE INVENTION

Figure 1:
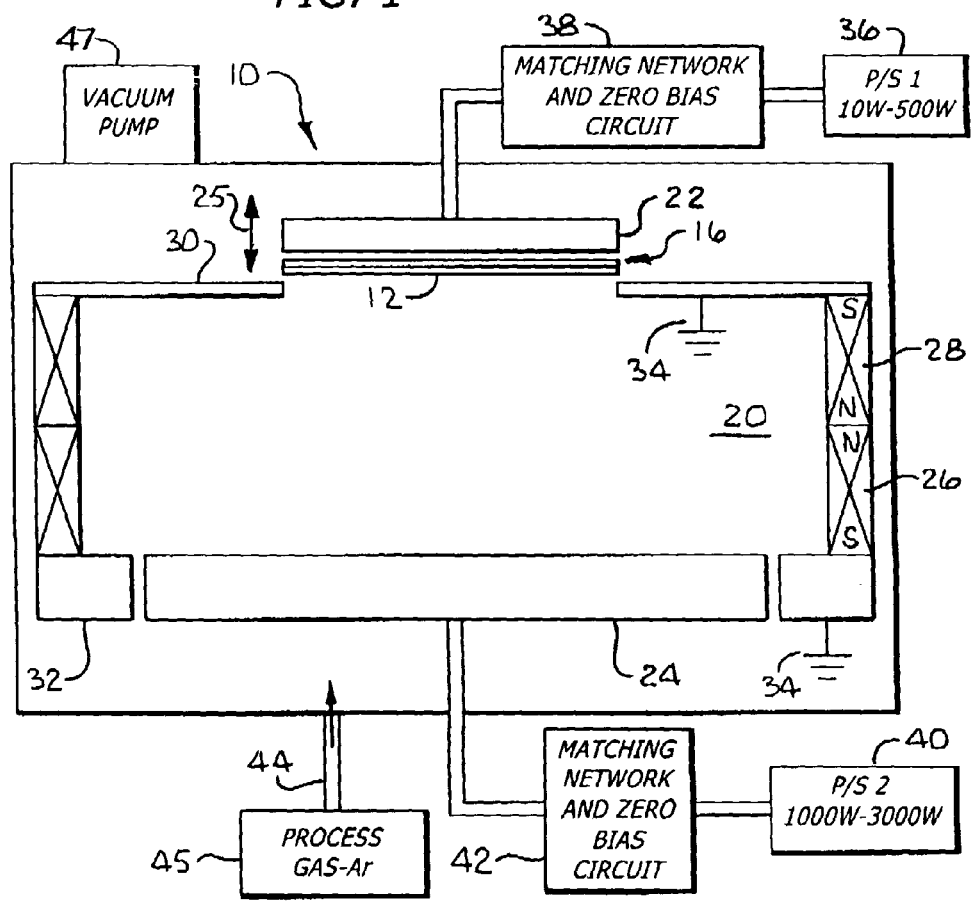
FIG. 1 is a schematic elevational view of apparatus constituting a preferred embodiment of the invention for etching a surface of an insulating layer in a wafer to produce an even and uniform surface, without any pits on the insulating layer.

FIGS. 1-4 show a preferred embodiment, generally indicated at 10, of apparatus for etching a surface 12 of an insulating layer 14 in a wafer generally indicated at 16. As will be appreciated, the wafer may be formed from a plurality of stacked layers, some of them electrically conductive and others electrically insulating. In addition to the insulating layer 14, an electrically conductive layer 15 and an electrically insulating base layer 17 are schematically shown to represent the different layers in the integrated circuit chip. The insulating layer 14 may have a plurality of a grooves or sockets 18. The insulating layer 14 may illustratively be made from a suitable material such as a polyamide.

Figure 2:
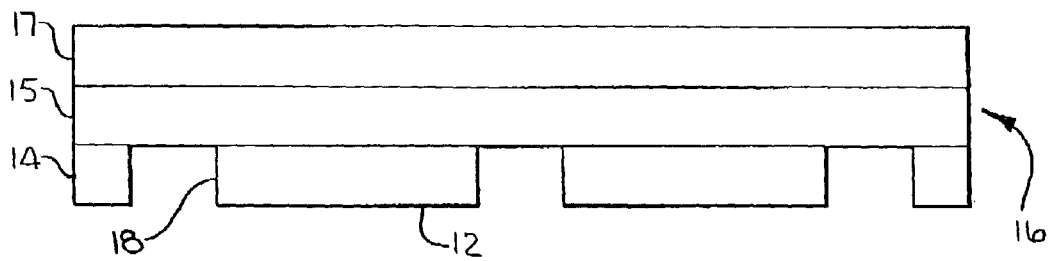
FIG. 2 is an enlarged fragmentary simplified schematic elevational view of the construction of a wafer.

The insulating layer 14 may illustratively have a thickness of approximately three (3) microns. The sockets 18 may be completely, or partially, formed through the thickness of approximately three (3) microns in the insulating layer 14. FIG. 2 illustratively shows the sockets 18 as extending completely through the thickness of the insulating layer 14. The preferred apparatus 10 of this invention illustratively may etch approximately one hundred angstroms (100 ÿ) from the surface 12 of the insulating layers 14 in a smooth and even layer and without any pits in the layer.

The apparatus 10 includes an enclosure 20 which may be formed in part by an electrode 22, an electrode 24 displaced from, but preferably substantially parallel to, the electrode 22 and magnets 26 and 28 disposed in a transverse (preferably substantially perpendicular) relationship to the electrodes 22 and 24. The electrode 22 is disposed in a contiguous and substantially parallel relationship to the wafer 16 and is movable in position toward or away from the wafer, as indicated by a double-headed arrow 25. The spacing between the wafer 16 and the electrode 22 may illustratively be in the order of 0.1-2 mm. A plate 30 extending from the magnet 26 in a substantially parallel, but spaced, relationship to the electrode 22 also defines the enclosure 20. A ring 32 extending from the magnet 28 to a position spaced from, but contiguous to, the electrode 24 also defines in part the enclosure 20.

The magnets 26 and 28 preferably constitute permanent magnets but they may also constitute magnetizable members on which windings are disposed to produce a saturable magnetic flux when a current flows through the windings. The magnets 26 and 28 may have a north polarization (indicated by the letter "N" in FIG. 1) at their positions of contiguity and may have a south polarization (indicated by the letter "S" in FIG. 1) at their opposite ends. The magnets 26 and 28, the plate 30 and the ring 32 are provided with a reference potential such as a ground 34. The wafer 16 is disposed in close proximity to the electrode 22 within the enclosure 20 and in substantially parallel relationship to the electrode. The wafer 16 is at a floating potential.

The electrode 22 receives a relatively low AC voltage from a power supply 36 at a suitable frequency such as approximately 13.56 MHz. As will be explained in detail subsequently, this causes the electrode 22 to receive a relatively low negative DC bias such as a negative bias in the order of −100 volts to −500 volts. A matching network 38 is preferably disposed electrically between the power supply 36 and the electrode 22 to match the impedance of the power supply to the impedance of the electrode.

The electrode 24 receives a relatively high AC voltage from a power supply 40 at a suitable frequency such as approximately 13.56 MHz. As will be explained in detail subsequently, this causes the electrode 24 to have a relatively high negative DC bias such as a negative bias in the order of −1000 volts to −3000 volts. A matching network and zero bias circuit 42 are preferably disposed electrically between the power supply 40 and the electrode 24 to match the impedance of the power supply to the impedance of the electrode and to provide substantially a ground potential on the electrode. The zero bias circuit may constitute an inductance between the electrode 24 and ground to provide a high impedance for alternating voltages and to provide a low impedance for a DC voltage. The power supplies 36 and 40 may constitute a single power supply.

A conduit 44 is provided for introducing molecules of an inert gas such as argon into the enclosure 20 from a source 45. The argon molecules pass into the enclosure 30 through the space between the electrode 24 and the ring 32. The argon molecules pass out of the enclosure 30 through the space between the plate 34 and the wafer 16. The argon gas flow through the enclosure 30 may illustratively be at a flow rate of 0.1-50 SCCM at a working pressure of 0.5-5 mTorr. The movement of the argon molecules through the enclosure 20 is facilitated by a vacuum pump 47.

A negative bias is produced on the electrode 22 because of the alternating voltage applied to the electrode. In the positive half cycles of the alternating voltage, the electrode 22 attracts electrons because of the electrical field between the electrode and the ground potential 34 on the plate 30. In the negative half cycles of the alternating voltage, positive ions are attracted to the electrode because of the electrical field between the electrode and the ground potential 34 on the plate 30. Since the electrons are considerably lighter in weight than the positive ions, they move faster toward the electrode 22 than the positive ions. This causes the electrons to accumulate in the space adjacent the electrode 22, thereby producing the negative DC bias on the electrode. The electrode 24 receives a negative bias because of the same physical phenomenon. However, the negative bias on the electrode 22 is considerably less than the negative DC bias on the electrode 24 because of the differences in the voltages applied to the electrodes.

As previously indicated, the magnetic field produced by the magnets 26 and 28 is substantially perpendicular to the electrical fields produced by the electrodes 22 and 24. This causes electrons in the enclosure 20 to move in a spiral or helical path between the electrode 22 and the plate 30, and between the electrode 24 and the ring 32, because of the ground potentials on the plate and the ring. The electrons strike molecules of argon gas and ionize these molecules. Since the electrical field between the electrode 24 and the ring 32 is considerably stronger than the electrical field between the electrode 22 and the plate 30, most of the ionization of argon molecules occurs in the region of the electrode 24. Some of these argon ions then move into the region of the electrode 22.

Figure 3:
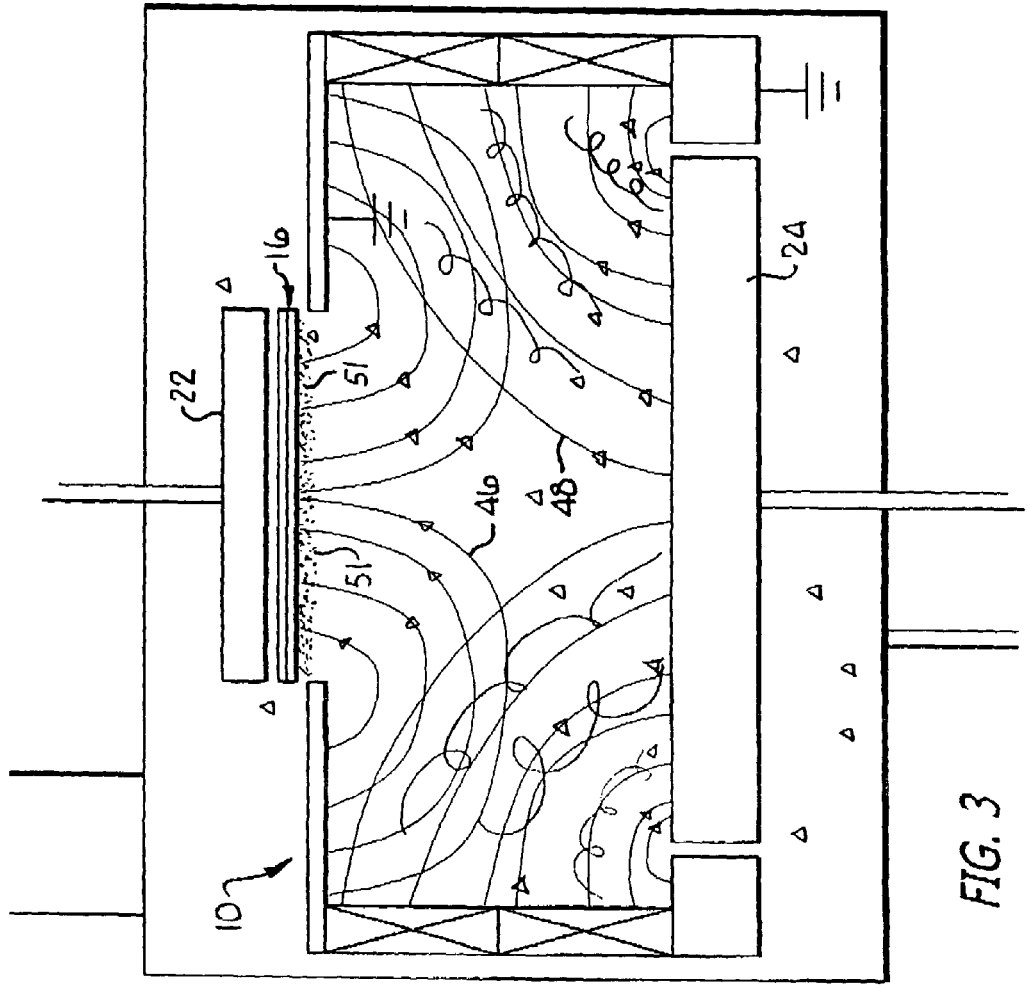
FIG. 3 is an enlarged schematic elevational view of electrical fields produced in an enclosure by the apparatus shown in FIG. 1, the wafer being disposed in the enclosure.

FIG. 3 illustrates at 46 lines of force produced by the electrical field between the electrode 22 and the plate 30. Arrows indicate the direction of the lines 46 of force. The electrons in the enclosure 20 travel in a spiral or helical path along the force lines 46, the spiral or helical path resulting from the force of the magnetic field as the electrons move along the force lines 46. In like manner, FIG. 3 illustrates at 48 lines of force produced by the electrical field between the electrode 24 and the ring 32 and between the electrode and the grounded magnets 26 and 28. The electrons in the enclosure 20 travel in a spiral or helical path along the force lines 48 because of the force on the electrons by the magnets 26 and 28.

Figures 5A, 5B:
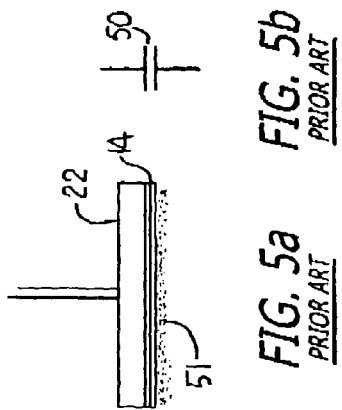

Applicant's assignee of record in this application has previously sold one (1) unit of apparatus with features similar to the apparatus shown in FIG. 1. This unit may have been sold more than one (1) year prior to the date of this application. However, there is one significant difference between the apparatus 10 constituting the preferred embodiment of the invention and the unit previously sold by applicant's assignee. The significant difference is that the wafer 16 engaged the electrode 22 in the one (1) unit sold prior to the date of this application. The circuit equivalent of this arrangement is shown in FIG. 5b and is indicated as prior art in that Figure. As previously indicated, the wafer 16 is separated from the electrode 22 in the preferred embodiment 10 of this invention.

As will be seen, the combination of the electrode 22 and the wafer 16 in FIG. 5a is seen as a single electrode or plate in a capacitor 50 in FIG. 5b. The other electrode or plate in the capacitor 50 is defined by the positive ions in the enclosure 20 at positions adjacent the electrode 24. These positive ions are schematically illustrated by dots (.) at 51 in FIG. 3. The dielectric between the plates of the capacitor 50 may be considered to be the insulating layer 14. The impedance of the capacitor 50 is accordingly relatively low because the insulting layer 14 is relatively thin and because the dielectric constant of the insulating layer is lower than the dielectric constant of air or the dielectric constant of a vacuum.

Since the impedance of the capacitor 50 is relatively low, a relatively large current flows through the capacitor. This current results from the attraction of the argon ions to the insulating layer 14 because of the negative DC voltage on the electrode 22. The relatively large current produces an etching of molecules and ions from the surface 12 of the insulating layer 14. This etching is of such a force that the etching is not smooth, even or uniform. Pitting of the surface of the insulating layer 14 accordingly occurs. The problem is particularly aggravated in considering the etching of the walls of the sockets 18 in the insulating layer 14.

Since the etching does not result in a smooth, even and uniform surface 12 of the insulating layer 14, any subsequent deposition of an electrically conductive layer on the surface 12 has significant differences in thickness of the electrically conductive material at different positions on the surface 12. This significantly affects the electrical characteristics of the electrical deposition on the insulating layer 14 and produces significant deterioration in the performance characteristics of the integrated circuit chips formed from the wafer.

As previously indicated, the wafer 16 is separated from the electrode 22 in the preferred embodiment 10 of this invention. The separation may be in the order of 0.1 to 2.0 millimeters. This causes two (2) capacitors 52 and 54 in FIG. 4b to be defined by the electrode 22, the wafer 16 and the charge produced by the argon ions 51 in the enclosure 20 in the vicinity of the electrode 22. The plates of the capacitor 52 in FIG. 4b may be respectively considered to be defined by the electrode 22 and by the electrically conductive deposition layers in the wafer 16. Although there may be argon ions in this gap, the argon ions are relatively small in number. Furthermore, the gap is so small that the argon ions cannot be accelerated to any significant degree. Because of these factors, the dielectric in the capacitor 52 in FIG. 4b may be considered to be the gap between the electrode 22 and the wafer 16. This gap causes the impedance of the capacitor 52 to be relatively high. This impedance can be adjusted to any desired value by adjusting the position of the electrode 22 in the opposite directions 25 to vary the distance between the electrode and the wafer 16.

Figures 4A, 4B:
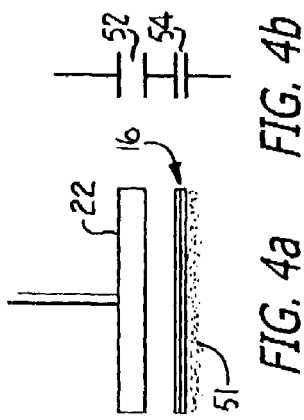
FIG. 4a is an enlarged fragmentary elevational schematic view showing the disposition of particular ones of the components in the preferred embodiment of FIG. 1.
FIG. 4b is an enlarged fragmentary schematic circuit diagram showing the electrical equivalent of the components in FIG. 4a as a pair of capacitors in series, one of the capacitors having a high impedance and the other capacitor having a low impedance.

The capacitors 52 and 54 may be considered to be in series as shown in FIG. 4b. The capacitor 54 may be considered to have plates defined by the electrically conductive layers in the wafer 16 and by the charge provided by the argon ions 51 in the enclosure 20 in the vicinity of the electrode 20. The dielectric for the capacitor 54 may be considered to be the insulating layer 14. The impedance of the capacitor 54 is relatively low, particularly in relation to the impedance of the capacitor 52, because of the thin dimension of the insulating layer 14 and the dielectric constant of the insulating layer.

The current through the series circuit including the capacitors 52 and 54 in FIG. 4b is limited and controlled by the capacitor 52 because of the high impedance of the capacitor. This limited and controlled current provides a gentle etching of the surface 12 of the insulating layer 14 and of the walls of the sockets 18. As a result, any specified amount of material may be etched from the surface 12 of the insulating layer 14 and from the walls of the sockets 18. For example, an etching of the material of the insulating layers 14 and the walls of the sockets 18 may be provided in a thickness of approximately one hundred angstroms (100 ÿ).

The etching produces smooth, even and uniform surfaces of the insulating layer 14 by the apparatus 10 as a result of the etching. This provides for a deposition of a smooth, uniform and even thickness of an electrically conductive material on the etched surface of the insulating layer 14. The etching of the walls in the sockets 18 is also even, uniform and smooth. This constitutes a distinct advance over the prior art, even the prior art as represented by the single unit of the apparatus sold by applicant's assignee prior to the filing date of this application, this prior unit being shown in FIG. 5a and being represented by the electrical circuitry shown in FIG. 5b.

As shown schematically in FIG. 4a, balls 60 made from a suitable material such as copper may be provided on the electrically conductive surface of the wafer 160. The balls 60 operate as electrical leads. The balls 60 are known in wafers of the prior art. The balls 60 are not affected by the actions of the capacitances 52 and 54 in FIG. 4b.

Although the invention has been disclosed and illustrated with relation to particular embodiments, the principles involved are capable of being used in numerous other embodiments which will be apparent to persons of ordinary skill in the art. The invention is, therefore, to be limited only as indicated by the scope of the appended claims.

What is claimed is:

1. A method of etching an insulating layer in a wafer to present a clean and fresh surface on the insulation layer for a deposition on the insulating layer, including the steps of:

providing a relatively strong electrical field at first positions in an enclosure, providing a relatively weak electrical field at second positions displaced in the enclosure from the first positions, the relatively weak electrical field defining a capacitor with a high impedance to limit the transfer of electrical charges to the insulating layer in the wafer, passing molecules of an inert gas through the enclosure, and providing a magnetic field in the enclosure in a direction relative to the strong electrical field to obtain a movement of electrons in the enclosure at the positions of the strong electrical field and an ionization of molecules of the inert gas by the electrons and a movement of the ions in a direction relative to the weak electrical field to obtain a movement of the ions, in accordance with the high impedance of the capacitor defined by the relatively weak field, to the second electrode at a speed for etching the surface of the insulating layer on the wafer substantially uniformly without pitting the insulating layer, wherein
the capacitor constitutes a first capacitor and wherein
the relatively weak electrical field is defined by the first capacitor and a second capacitor in a series circuit and wherein
the first capacitor is defined by plates constituting an electrode and the wafer and in which the plates are separated by a space in which molecules and ions of the inert gas are disposed to define the insulator for the capacitor and to provide the first capacitor with the high impedance and wherein
a second capacitor is defined by plates constituting the wafer and the ions of the inert gas in the enclosure and wherein the plates are separated by the insulating layer in the wafer to define the insulator of the second capacitor and to provide the second capacitor with a relatively low impedance in comparison to the high impedance of the first capacitor.

2. A method as set forth in claim 1 wherein
the relatively strong electrical field is provided in a first direction and
the relatively weak electrical field is provided in a second direction opposite to the first direction and wherein
the magnetic field is provided in a direction transverse to the first and second directions to produce a movement of the electrons in the enclosure in a helical path for facilitating the ionization of molecules of the inert gas in the enclosure.

3. A method as set forth in claim 1
the wafer is disposed in the weak electrical field and wherein
the molecules of the inert gas are passed through the enclosure initially to positions in the strong electrical field to obtain an ionization of molecules of the inert gas and subsequently through the enclosure to positions in the weak electrical field to facilitate an etching of the surface of the insulating layer on the wafer by the ions.

4. A method as set forth in claim 1 wherein
the wafer is disposed in the relatively weak electrical field and wherein
an electrode providing the relatively weak field is spaced from, but disposed relatively close to, the wafer to cooperate with the wafer in providing a high impedance in the capacitor and a circuit including the capacitor for attracting the ions in the weak electrical field to the wafer to etch the surface of the insulating layer on the wafer without pitting the insulating layer.

5. A method as set forth in claim 1 wherein
the relatively strong electrical field is provided by a first electrode and a first alternating voltage providing a relatively high negative bias on the first electrode and wherein
the relatively weak electrical field is provided by a second electrode and by a second alternating voltage providing a relatively low bias on the second electrode.

6. A method as set forth in claim 1 wherein
the wafer is disposed in the weak electrical field and wherein
the molecules of the inert gas are passed through the enclosure initially through positions in the strong electrical field to obtain an ionization of molecules of the inert gas and subsequently through positions in the weak electrical field to facilitate an etching of the surface of the insulating layer on the wafer by the ions and wherein
an electrode providing the relatively weak field is spaced from, but disposed relatively close to, the wafer to cooperate with the wafer in providing a high impedance in the capacitor and a circuit including the capacitor for attracting the ions in the weak electrical field to the wafer to etch the surface of the insulating layer on the wafer without pitting the insulating layer.

7. A method of etching an insulating layer on a wafer to present a clean and fresh surface on the insulating layer for deposition, including the steps of
passing molecules of an inert gas through an enclosure,
disposing a first electrode in the enclosure to provide a strong electrical field in a first direction at first positions in the enclosure to ionize molecules of the inert gas in the enclosure,
disposing a second electrode in the enclosure to provide a weak electrical field at second positions in the enclosure in a second direction opposite to the first direction,
providing a magnetic field in the enclosure, in a direction transverse to the first and second directions, to cooperate with the strong electrical field in producing charged particles in the enclosure and to cooperate with the weak electrical field in producing a transfer of the charged particles to the surface of the insulating layer in the wafer to provide a weak and controlled etching of the surface of the insulating layer without producing pits in the surface of the insulating layer, wherein
the second electrode and the wafer constitute plates of a first capacitor and ions and molecules of the inert gas constitute the dielectric of the first capacitor and wherein
the wafer and the ions of the inert gas constitutes plates of a second capacitor and wherein the insulating layer of the wafer constitute the dielectric of the second capacitor and wherein
the first capacitor has a higher impedance than the second capacitor.

8. A method as set forth in claim 7 wherein
the molecules of the inert gas pass through the enclosure from the strong electrical field to the weak electrical field and wherein
the magnetic field is substantially perpendicular to the first and second electrical fields.

9. In a combination in claim 7 wherein
the strong electrical field is defined in part by the first electrode and by an alternating voltage applied at a first magnitude to the first electrode to bias the first electrode at a negative DC potential with a first magnitude and wherein
the weak electrical field is defined in part by the second electrode and by an alternating voltage applied to the second electrode at a second magnitude less than the first magnitude to bias the second electrode at a negative DC potential with a second magnitude less than the first magnitude for producing the transfer of the charged particles to the surface of the wafer to provide the weak and controlled etching of the surface of the insulating layer without producing pits in the surface of the insulating layer.

10. In a combination as set forth in claim 7 wherein
the magnetic field is provided by magnetic members and wherein
the magnetic members and the first and second electrodes define the enclosure.

11. In a combination as set forth in claim 7 wherein the wafer is disposed in the weak electrical field and is separated from the second electrode in the weak electrical field.

12. In a combination as set forth in claim 7 wherein the magnetic field is substantially perpendicular to the strong and weak electrical fields and wherein the molecules of the inert gas pass into the enclosure through the strong magnetic field and the molecules and the ions of the inert gas pass from the enclosure through the weak electrical field.

* * * * *